United States Patent
Lehtiniemi et al.

(10) Patent No.: US 11,877,127 B2
(45) Date of Patent: Jan. 16, 2024

(54) AUDIO CAPTURE IN PRESENCE OF NOISE

(71) Applicant: Nokia Technologies Oy, Espoo (FI)

(72) Inventors: Arto Lehtiniemi, Lempäälä (FI); Miikka Vilermo, Siuro (FI); Anssi Rämö, Tampere (FI); Toni Mäkinen, Pirkkala (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 17/590,054

(22) Filed: Feb. 1, 2022

(65) Prior Publication Data

US 2022/0272471 A1 Aug. 25, 2022

(30) Foreign Application Priority Data

Feb. 19, 2021 (EP) ..................................... 21158158

(51) Int. Cl.
*H04R 29/00* (2006.01)
*G06V 20/00* (2022.01)
(Continued)

(52) U.S. Cl.
CPC ........... *H04R 29/005* (2013.01); *G06V 20/35* (2022.01); *H03G 3/342* (2013.01); *H04S 7/30* (2013.01); *H04S 2400/15* (2013.01)

(58) Field of Classification Search
CPC .. H04R 29/005; H04R 2499/11; G06V 20/35; H03G 3/342; H04S 7/30; H04S 2400/15
(Continued)

(56) References Cited

U.S. PATENT DOCUMENTS 7,852,369 B2   12/2010   Cutler et al.
8,170,277 B2   5/2012   Michimoto et al.
(Continued)

FOREIGN PATENT DOCUMENTS

CN   101572804 A   11/2009
JP   2006/211708 A   8/2006
(Continued)

OTHER PUBLICATIONS

O'Donovan et al., "Microphone Arrays as Generalized Cameras for Integrated Audio Visual Processing", IEEE Conference on Computer Vision and Pattern Recognition, Jun. 17-22, 2007, 8 pages.
(Continued)

*Primary Examiner* — William A Jerez Lora
(74) *Attorney, Agent, or Firm* — ALSTON & BIRD LLP (57) ABSTRACT

An apparatus comprising means for:
  capturing an audio scene using multiple microphones;
  determining that the captured audio scene has unacceptable detected noise;
  in dependence upon determining that the captured audio scene has unacceptable detected noise,
  searching both different sets of one or more microphones and different physical rotation angles of the microphones to find a combination of a first set of one or more microphones and a first physical rotation angle of the microphones that captures the audio scene with acceptable detected noise; and
  controlling the physical rotation angle of the microphones to be the first physical rotation angle of the microphones and capturing the audio scene using the combination of the first set of one or more microphones and the first physical rotation angle of the microphones.

20 Claims, 5 Drawing Sheets

(51) Int. Cl.
*H03G 3/34* (2006.01)
*H04S 7/00* (2006.01)

(58) Field of Classification Search
USPC .................. 381/56, 58, 94.5, 122, 124, 355
See application file for complete search history.

(56) References Cited

U.S. PATENT DOCUMENTS

| | | | |
|---|---|---|---|
| 9,246,543 | B2 | 1/2016 | Zhou et al. |
| 9,807,530 | B1 | 10/2017 | Tisch et al. |
| 10,606,546 | B2* | 3/2020 | Yliaho .............. H04M 1/72454 |
| 2010/0280824 | A1 | 11/2010 | Petit et al. |
| 2012/0120237 | A1* | 5/2012 | Trepess ................. H04N 5/144 |
| | | | 382/103 |
| 2012/0163625 | A1 | 6/2012 | Siotis et al. |
| 2013/0179785 | A1* | 7/2013 | Kim ...................... G06F 3/0354 |
| | | | 715/719 |
| 2014/0126726 | A1 | 5/2014 | Heiman et al. |
| 2015/0326748 | A1 | 11/2015 | Tisch et al. |
| 2017/0220036 | A1* | 8/2017 | Visser .................. G05D 1/0094 |
| 2019/0253795 | A1 | 8/2019 | Ozcan et al. |
| 2020/0053285 | A1 | 2/2020 | Tisch et al. |

FOREIGN PATENT DOCUMENTS

| | | |
|---|---|---|
| JP | 2014/112830 A | 6/2014 |
| JP | 2015/082745 A | 4/2015 |
| JP | 2019/080246 A | 5/2019 |
| WO | 2009/142332 A1 | 11/2009 |

OTHER PUBLICATIONS

Yoshida et al., "A Novel Wind Noise Reduction for Digital Video Camera", Digest of Technical Papers—International Conference on Consumer Electronics, Jan. 9-13, 2008, 2 pages.
Extended European Search Report received for corresponding European Patent Application No. 21158158.2, dated Jul. 2, 2021, 8 pages.
Office Action for Japanese Application No. 2022-023893 dated Jun. 29, 2023, 7 pages.
Office Action for European Patent Application No. 21158158.2 dated Sep. 14, 2023, 11 pages.

* cited by examiner

Left Side
FIG 1A

Bottom
FIG 1B

Front
FIG 1C

Right Side
FIG 1D

Top
FIG 1E

AUDIO CAPTURE IN PRESENCE OF NOISE

TECHNOLOGICAL FIELD

Embodiments of the present disclosure relate to audio capture in the presence of noise.

BACKGROUND

An audio scene captured using one or more microphones can suffer from noise.

In some examples, it is possible to improve a signal (the audio scene) and reduce noise by digitally processing the audio scene using noise reduction algorithms. In some examples, frequency-dependent attenuation can be used. In some circumstances, correlation of signals from spatial separated microphones can be used.

However, noise reduction algorithms are not always effective. This is particularly true if the noise prevents or inhibits capture of the signal.

In some circumstances the dynamic response of a microphone is saturated by its response to noise. In such circumstances, the signal that is additional to the noise cannot be detected.

BRIEF SUMMARY

According to various, but not necessarily all, embodiments there is provided an apparatus comprising means for:
  capturing an audio scene using multiple microphones;
  determining that the captured audio scene has unacceptable detected noise;
  in dependence upon determining that the captured audio scene has unacceptable detected noise, searching both different sets of one or more microphones and different physical rotation angles of the microphones to find a combination of a first set of one or more microphones and a first physical rotation angle of the microphones that captures the audio scene with acceptable detected noise; and
  controlling the physical rotation angle of the microphones to be the first physical rotation angle of the microphones and capturing the audio scene using the combination of the first set of one or more microphones and the first physical rotation angle of the microphones.

In some but not necessarily all examples, the means for controlling the physical rotation angle of the microphones comprises means for electrically controlling the physical rotation angle of a mounted camera comprising an image sensor for capturing a visual scene and at least some of the multiple microphones.

In some but not necessarily all examples, the apparatus comprises means for automatically tracking a selected visual object to keep the selected visual object within the captured visual scene.

In some but not necessarily all examples, the apparatus comprises means for automatically moving a logical sub-portion of the image sensor, used to capture an image of a visual scene, across the image sensor to keep a selected visual object within the captured visual scene.

In some but not necessarily all examples, the apparatus comprises means for automatically re-sizing a logical portion of the image sensor, used to capture an image of a visual scene, to keep a selected visual object within the captured visual scene.

In some but not necessarily all examples, the apparatus comprises means for enabling a user to select the visual object.

In some but not necessarily all examples, the apparatus comprises an additional camera comprising an image sensor for capturing a visual scene wherein the camera and the additional camera have different points of view, the apparatus comprising means for using the camera or the additional camera to keep a selected visual object within the captured visual scene.

In some but not necessarily all examples, searching both different sets of one or more microphones and different physical rotation angles of the microphones to find a combination of a first set of one or more microphones and a first physical rotation angle of the microphones that captures the audio scene with acceptable detected noise is dependent upon one or more parameters, controlled by a user, that change relative prioritization between a captured visual scene and a captured audio scene.

In some but not necessarily all examples, the means for controlling the physical rotation angle of the microphones comprises means for electrically controlling the physical rotation angle of a mounted camera comprising an image sensor for capturing a visual scene and the microphones, wherein the search of different physical rotation angles of the microphones is a constrained search, wherein the physical rotation angles of the mounted camera are constrained such that a selected visual object remains within the captured visual scene at the first physical rotation angle of the microphones.

In some but not necessarily all examples, the search of different sets of one or more microphones is a constrained search, wherein noisy microphones are removed from the different sets of one or more microphones.

In some but not necessarily all examples, the different physical rotation angles of the microphones that are searched comprise multiple components, wherein searching different physical rotation angles of the microphones comprises searching different combinations of values for the components of the physical rotation angles of the microphones.

In some but not necessarily all examples, searching both different sets of one or more microphones and different physical rotation angles of the microphones to find, as an outcome, a combination of a first set of one or more microphones and a first physical rotation angle of the microphones that captures the audio scene with acceptable detected noise is a search to find
  the outcome with a maximum number of undistorted microphones
  or
  the outcome where a noise reduction algorithm performs optimally.

In some but not necessarily all examples, the apparatus comprises means for using a wind noise detection algorithm to detect unacceptable detected noise.

According to various, but not necessarily all, embodiments there is provided a computer program that when run by one or more processors enables:
  in dependence upon a determination that a captured audio scene has unacceptable detected noise, searching both different sets of one or more microphones of a microphone arrangement and different physical rotation angles of the microphone arrangement to find a combination of a first set of one or more microphones of the microphone arrangement and a first physical rotation angle of the microphone arrangement that captures the audio scene with acceptable detected noise; and controlling the physical rotation angle of the microphone arrangement to be the first physical rotation angle of the microphone arrangement and capturing the audio scene using the combination of the first set of one or more microphones of the microphone arrangement and the first physical rotation angle of the microphone arrangement.

According to various, but not necessarily all, embodiments there is provided a method comprising:

determining that a captured audio scene, captured using a microphone arrangement comprising multiple microphones, has unacceptable detected noise;

in dependence upon a determination that the captured audio scene has unacceptable detected noise, searching both different sets of one or more microphones of a microphone arrangement and different physical rotation angles of the microphone arrangement to find a combination of a first set of one or more microphones of the microphone arrangement and a first physical rotation angle of the microphone arrangement that captures the audio scene with acceptable detected noise; and controlling the physical rotation angle of the microphone arrangement to be the first physical rotation angle of the microphone arrangement and capturing the audio scene using the combination of the first set of one or more microphones of the microphone arrangement and the first physical rotation angle of the microphone arrangement.

According to various, but not necessarily all, embodiments there is provided examples as claimed in the appended claims.

According to various, but not necessarily all, embodiments there is provided an apparatus comprising means for:

capturing an audio scene using a microphone arrangement comprising multiple microphones;

determining that the captured audio scene has unacceptable detected noise;

in dependence upon determining that the captured audio scene has unacceptable detected noise, searching both different sets of one or more microphones of the microphone arrangement and different physical rotation angles of the microphone arrangement to find a combination of a first set of one or more microphones of the microphone arrangement and a first physical rotation angles of the microphone arrangement that captures the audio scene with acceptable detected noise; and controlling the physical rotation angles of the microphone arrangement to be the first physical rotation angles of the microphone arrangement and capturing the audio scene using the combination of the first set of one or more microphones of the microphone arrangement and the first physical rotation angles of the microphone arrangement.

According to various, but not necessarily all, embodiments there is provided a method comprising:

capturing an audio scene;

controlling physical rotation of a mounted camera comprising an image sensor and microphones, to reposition the image sensor and the microphones, wherein repositioning the microphones reduces detected noise at the microphones;

automatically moving a logical sub-portion of the image sensor, used to capture an image of a visual scene, across the image sensor to keep a selected visual object within the captured visual scene.

BRIEF DESCRIPTION

Some examples will now be described with reference to the accompanying drawings in which:

FIGS. 9A, 9B to 16A to 16B illustrate examples of image sensors (FIGS. 9A to 16A) and the respective visual scenes captured by the image sensors (FIGS. 9B to 16B);

DETAILED DESCRIPTION

The following description and the drawings relate to examples of an apparatus 20 comprising means for:

capturing an audio scene 4 using multiple microphones 2;

determining that the captured audio scene 4 has unacceptable detected noise;

in dependence upon determining that the captured audio scene 4 has unacceptable detected noise, searching both different sets of one or more microphones 2 and different physical rotation angles 44 of the microphones 2 to find a combination of a first set of one or more microphones 2 and a first physical rotation angle 44 of the microphones 2 that captures the audio scene 4 with acceptable detected noise; and controlling the physical rotation angle 44 of the microphones 2 to be the first physical rotation angle 44 of the microphones 2 and capturing the audio scene 4 using the combination of the first set of one or more microphones 2 and the first physical rotation angle 44 of the microphones 2.

The search finds an acceptable combination of physical rotation angle 44 and used microphones 2.

Acceptable detected noise can, for example, be noise that does not exceed a threshold. Unacceptable detected noise can, for example, be noise that does exceed a threshold.

The threshold can for example be a maximum response of a microphone 2. Acceptable detected noise can, for example, be noise that does not exceed the maximum response of a microphone 2, for example, does not exceed the maximum pressure level of any microphone 2. Unacceptable detected noise can, for example, be noise that does exceed the maximum response of a microphone, for example, does exceed the maximum pressure level of the microphone.

In some embodiments the threshold may be a threshold for level difference between two microphone signals. The level may be calculated as signal energy in short time segments (e.g. 20 ms) and/or narrow frequency bands (width somewhere between 20 Hz-2 kHz)

The threshold can for example be a measure of energy within one or more frequency bands. For example, wind noise may be detected as high intensity signals at lower frequencies (gusts) and/or high intensity signals at higher frequencies (wind shear).

FIGS. 1A to 1E and FIG. 2 illustrate an example of the apparatus 20. The apparatus 20 comprises multiple microphones 2 for capturing an audio scene 4.

The microphones 2 can have different physical rotation angles 44. The physical rotation angle 44 of the microphones 2 can be controlled electrically. The microphones 2 can be controlled electrically to move between different physical rotation angles 44.

In this example, the microphones 2 form a microphone arrangement 10. In this example, the microphone arrangement 10 can have different physical rotation angles 44. The physical rotation angle 44 of the microphone arrangement 10 can be controlled electrically. The microphone arrangement 10 can be controlled electrically to move between different physical rotation angles 44

Thus in these examples, the apparatus 20 comprises means for:
  capturing an audio scene 4 using a microphone arrangement 10 comprising multiple microphones 2;
  determining that the captured audio scene 4 has unacceptable detected noise;
  in dependence upon determining that the captured audio scene 4 has unacceptable detected noise, searching both different sets of one or more microphones 2 of the microphone arrangement 10 and different physical rotation angles 44 of the microphone arrangement 10 to find a combination of a first set of one or more microphones 2 of the microphone arrangement 10 and a first physical rotation angle 44 of the microphone arrangement 10 that captures the audio scene 4 with acceptable detected noise; and
  controlling the physical rotation angle 44 of the microphone arrangement 10 to be the first physical rotation angle 44 of the microphone arrangement 10 and capturing the audio scene 4 using the combination of the first set of one or more microphones 2 of the microphone arrangement 10 and the first physical rotation angle 44 of the microphone arrangement 10.

In at least some examples, the multiple microphones 2 have fixed relative displacements and/or fixed orientations. The microphone arrangement 10 of microphones can therefore be a fixed arrangement of microphones 2.

In some examples, one microphone 2 can be moved or oriented relative to another microphone 2.

The apparatus 20 is an audio-visual apparatus. It not only comprises the microphones 2 as previously described but also comprises at least one camera 22. The at least one camera 22 comprises an image sensor 24 for capturing a visual scene 6.

Figure 1A:
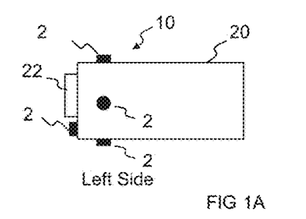
FIGS. 1A to 1E illustrate different views of an example of an apparatus.
Figure 1B:
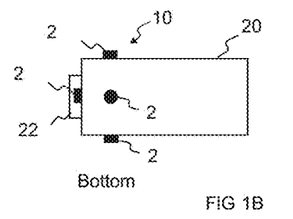
Figure 1C:
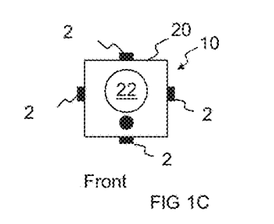
Figure 1D:
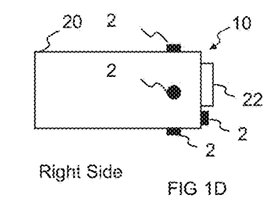
Figure 1E:
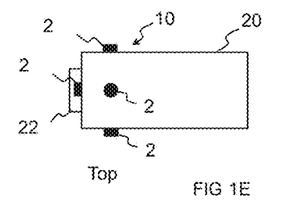

FIG. 1A is a left side view of the apparatus 20. FIG. 1B is a bottom view of the apparatus 20. FIG. 1C is a from view of the apparatus 20. FIG. 1D is a right side view of the apparatus 20. FIG. 1E is a top view of the apparatus 20.

In this illustrated example, but not necessarily all examples, the camera 22 is positioned on a front face of the apparatus 20 and microphones 2 have different orientations. In this example, the microphones 2 have different orientations because they are associated with differently oriented faces. In this example there is a microphone 2 on the left-side face (FIG. 1A), a microphone 2 on the bottom face (FIG. 1B), a microphone 2 on the front face (FIG. 1C), a microphone 2 on the right-side face (FIG. 1D), and a microphone 2 on the top face (FIG. 1E).

In this example, the multiple microphones 2 have fixed relative displacement and fixed orientation relative to the camera 22.

The physical rotation angle 44 of the apparatus 20, is also the physical rotation angle 44 of the microphones 2 and of the camera 22.

The apparatus 20 can have different physical rotation angles 44. The physical rotation angle 44 of the apparatus 20 can be controlled electrically and the apparatus 20 can be controlled electrically to move between different physical rotation angles 44

When the apparatus 20 has different physical rotation angles 44, the microphone arrangement 10 (and the camera 22) has different physical rotation angles 44. When the physical rotation angle 44 of the apparatus 20 is controlled electrically, the physical rotation angle 44 of the microphone arrangement 10 (and the camera 22) is controlled electrically. When the apparatus 20 is controlled electrically to move between different physical rotation angles 44, the microphone arrangement 10 (and the camera 22) moves between different physical rotation angles 44

The orientation direction (point of view) of the apparatus 20 is illustrated by orientation vector 30.

Figure 2:
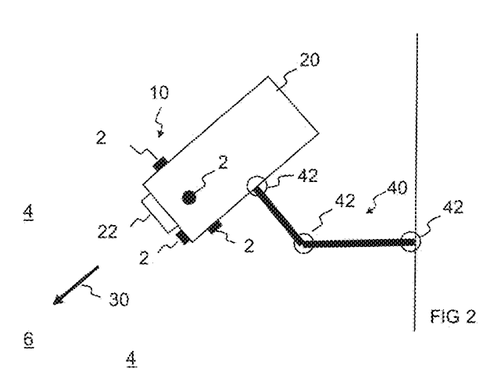
FIG. 2 illustrates an example of an apparatus, in use.

The camera 22 is mounted on the apparatus 20. In this example, the apparatus 20 moves on a support 40. The support 40 comprises a number of joints 42. One of more of the joints is movable. The physical rotation angle 44 of the apparatus 20 and therefore the direction of the orientation vector 30 can be controlled electrically by controlling electrically the angle at one or more of the joints 42. This can be achieved using a motor, for example a servo motor.

It will therefore be appreciated that the physical rotation angle 44 can be defined using one or more components, for example one for each joint angle.

Figure 3:
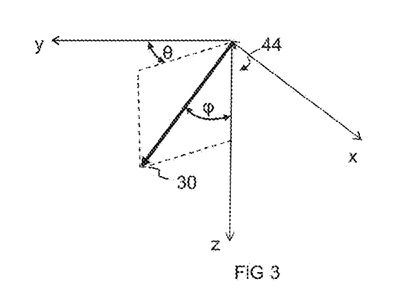
FIG. 3 illustrates an example of a physical rotation angle.

FIG. 3 illustrates an example of a physical rotation angle 44 that defines an orientation vector 30. In this example, the physical rotation angle 44 is comprised of two spherical co-ordinate components an elevation angle $\varphi$ and an azimuthal angle $\theta$. The azimuthal angle corresponds to a pan and the elevation angle corresponds to tilt.

In other examples, the physical rotation angle 44 that defines the orientation vector 30 can comprise three components: tilt rotation (rotation about a transverse horizontal axis), yaw rotation (rotation about a vertical axis) and roll rotation (rotation about a longitudinal horizontal axis). Yaw corresponds to pan.

Thus, the different physical rotation angles 44 of the microphones 2 that are searched can comprise multiple components. Each component is a rotational degree of freedom.

Searching the different physical rotation angles 44 of the microphones 2 when they comprise multiple components comprises searching different combinations of values for the components of the physical rotation angles 44 of the microphones 2.

Figure 4A:
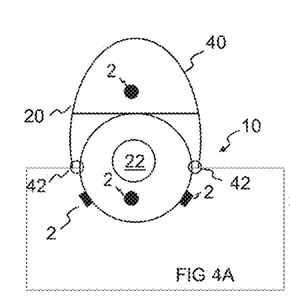
FIGS. 4A, 4B, 4C and 4D illustrate further examples of the apparatus.

FIG. 4A illustrates another example of the apparatus 20 as previously described.

In this example, one or more microphones 2 can be moved or oriented relative to one or more other microphones 2.

In this example, the apparatus 20 revolves within the support 40 via joints 42. A gimbal arrangement may be used to enable rotation in multiple directions of the apparatus 20 and its mounted camera 22.

In this example, one or more of the microphones 2 are positioned on the support 40. Thus, some but not all of the multiple microphones 2 do not rotate with camera 22 and do not have a fixed relative displacement and fixed orientation relative to the camera. The camera 22 can be rotated relative to one or more microphones 2, for example one or more microphones on the support 40.

Figure 4B:
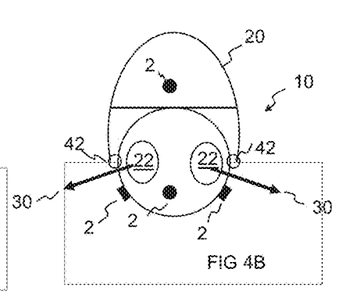

FIG. 4B illustrates another example of the apparatus 20 as previously described.

In this example, the apparatus 20 is similar to that described with reference to FIG. 4A. However, in this example, the apparatus 20 comprises multiple cameras 22 that have different orientation vectors 30 (different points of view). The fields of view of the cameras 22 can in some examples overlap. The orientation vectors 20 of the cameras 22 can have a fixed relationship relative to each other.

Figure 4C:
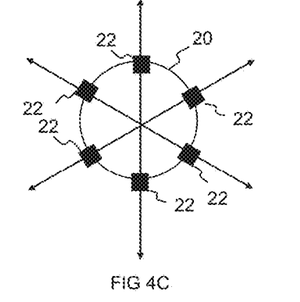

FIG. 4C illustrates another example of the apparatus 20 as previously described.

In this example, the apparatus 20 comprises multiple cameras 22 arranged so that the fields of view of adjacent cameras 22 overlap. The effective field of view made up of the overlapping fields of view of the cameras can be 360 degrees. In this example, it is possible stitch the images from the cameras 22 together to get a panoramic image. The panoramic image can, for example, be a 360 degree annular segment of a sphere at the equator of the sphere (the azimuthal plane).

The orientation vectors 20 of the cameras 22 can have a fixed relationship relative to each other. The panoramic image can therefore be invariant to 2D rotation of the apparatus 20 in the azimuthal plane.

In this example, the fixed arrangement of cameras 22 is rotationally symmetric. However, the fixed arrangement 10 of microphones 2 (not illustrated in FIG. 4C) can be asymmetric. Thus, noise reduction can be achieved by rotation of the apparatus 20 (changing orientation of the fixed microphone arrangement 10) without adversely affecting the captured visual scene 6.

The above example can be extended to a situation where the cameras 22 are arranged in three dimensions so that the fields of view of adjacent cameras 22 overlap. The effective field of view made up of the overlapping fields of view of the cameras can be 360 degrees in an azimuthal plane (or less) and between +90 and −90 degrees in a polar plane. In this example, it is possible stitch the images from the cameras 22 together to get a spherical panoramic image. The panoramic image can, for example, be surface of a sphere. This panoramic image is invariant to 3D rotation of the apparatus 20.

Figure 4D:
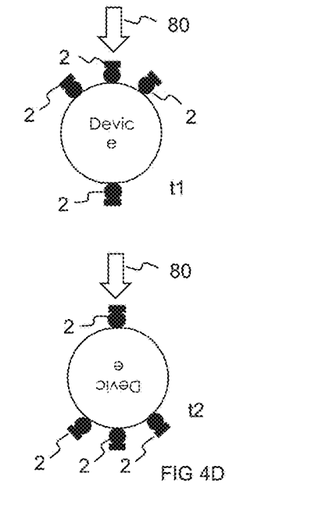

FIG. 4D illustrates another example of the apparatus 20 as previously described. In this example, the apparatus 20 comprises a fixed, asymmetric arrangement 10 of microphones 22. At time t1 a majority of the microphones 22 are exposed to noise, for example wind noise 80. However, after moving the apparatus 20, at time t2, a majority of the microphones 22 are not exposed to noise e.g. positioned on a leeward side of the apparatus 20 and sheltered from wind noise 80 by the apparatus 20.

In some examples, the apparatus 20 rotates until an optimum rotation is obtained. In other examples, the apparatus 20 rotates by an amount estimated to be optimum amount.

Figure 5:
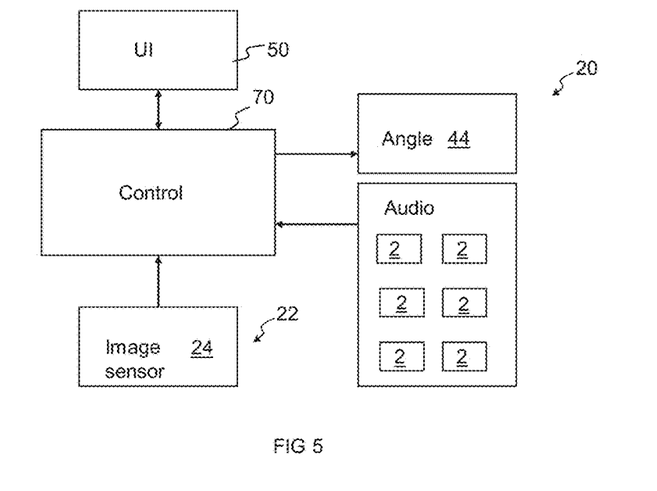
FIG. 5 illustrates an example of the apparatus and it control architecture.

FIG. 5 illustrates an example of the apparatus 20 comprising a controller 70 configured to capture an audio scene 4 using multiple microphones 2.

The controller 70 is configured to process inputs from the microphones 2 to detect noise in the captured audio scene 4 and is configured to determine whether or not the detected noise is acceptable or unacceptable.

The controller 70 is configured to perform a search if the detected noise is unacceptable. The purpose of the search is to enable capture of a new audio scene 4 that has less noise and preferably the new captured audio scene 4 will have acceptable detected noise.

The search is a search of both different sets of one or more microphones 2 and different physical rotation angles 44 of the microphones 2 to find a combination of a first set of one or more microphones 2 and a first physical rotation angle 44 of the microphones 2 that captures the audio scene 4 with acceptable detected noise.

The controller 70 is additionally configured to control the physical rotation angle 44 of the microphones 2 to be the first physical rotation angle 44 of the microphones 2.

The controller 70 is additionally configured to capture the audio scene 4 using the combination of the first set of one or more microphones 2 and the first physical rotation angle 44 of the microphones 2.

Figure 6:
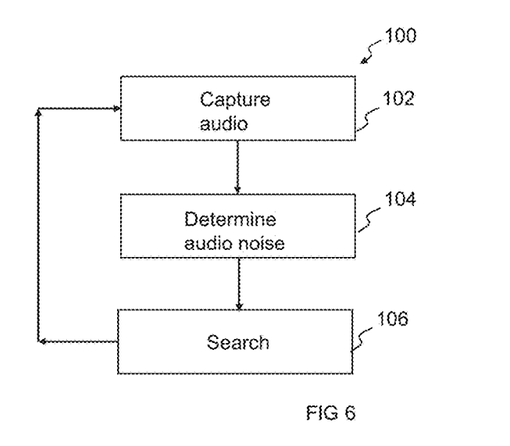
FIG. 6 illustrates an example of a method.

FIG. 6 illustrates an example of method 100. In this example, the method 100 is a method for capturing an audio scene 4.

At block 102, the method 100 comprises: capturing an audio scene 4 using multiple microphones 2.

At block 104, the method 100 comprises determining that the captured audio scene 4 has unacceptable detected noise.

If it is determined, at block 104, that the captured audio scene 4 has unacceptable detected noise the method moves to block 106. If it is determined, at block 104, that the captured audio scene 4 has acceptable detected noise the method stops or if it is operating continuously returns to block 102 (with or without a delay).

At block 106, the method 100 comprises searching both
  i) different sets of one or more microphones 2 of a microphone arrangement 10 and ii) different physical rotation angles 44 of the microphone arrangement 10
  to find a combination of a first set of one or more microphones 2 of the microphone arrangement 10 and a first physical rotation angle 44 of the microphone arrangement 10 that captures the audio scene 4 with acceptable detected noise.

The method 100, at block 106, comprises controlling the physical rotation angle 44 of the microphone arrangement 10 to be the first physical rotation angle 44 of the microphone arrangement 10.

The method 100 then comprises capturing the audio scene 4 using the combination of the first set of one or more microphones 2 of the microphone arrangement 10 and the first physical rotation angle 44 of the microphone arrangement 10.

The method 100 can stop or if it is operating continuously can return to block 102 for capturing the audio scene 4.

The search could be a search of all combinations of one or more microphones 2 and physical rotation angles 44 of the microphones 2. The first set of one or more microphones 2 and the first physical rotation angle 44 can, in this example, be the
combination of the set of one or more microphones 2 and the physical rotation angle 44 that maximizes (or minimizes) an objective cost function.

In some but not necessarily all examples, the maximum (or minimum) of the objective costs function can be achieved when the audio scene has least detected noise.

In other all examples, the maximum (or minimum) of the objective costs function can be achieved when the audio scene has detected noise below some threshold value and some other criterion is satisfied.

Examples of suitable criterion include any of, or any combination of:
the number of microphones used is maximal;
the number of microphones used is above a threshold;
the spatial arrangement of microphones used supports spatial audio;
the spatial arrangement of microphones used is non-linear;
the spatial arrangement of microphones used is three dimensional;
a quality of the audio scene is maximal;
a quality of the audio scene is above a threshold;
a quality of the audio scene, after noise cancellation processing, is maximal;
a quality of the audio scene, after noise cancellation processing, is above a threshold;
the audio scene includes a selected audio object;
a quality of the audio object is maximal;
a quality of the audio object is above a threshold;
a quality of the audio object, after noise cancellation processing, is maximal;
a quality of the audio object, after noise cancellation processing, is above a threshold;
a quality of the visual scene is maximal;
a quality of the visual scene is above a threshold;
the visual scene includes a selected visual object.

In at least some examples, the audio object and/or the visual object are selectable by the user using a user interface 50.

The term audio object means audio source. It does not necessarily imply object-based encoding of the audio.

Spatial audio at the capturing stage means that a three-dimension sound field is captured by multiple microphones. Spatial audio at the rendering stage means that some or all of the three-dimension sound field is rendered. Spatial audio at the capturing and the rendering stages can focus on one or more sound sources that have a three-dimensional location. That three-dimensional location can vary in time. The spatial arrangement of microphones used can support spatial audio if a single sound source, for example a selected sound source, is received at multiple microphones 2. This can be determined, for example, by correlation of the inputs from different microphones 2.

The objective cost function can be dependent upon one or more parameters, controlled by a user, that change relative prioritization between a captured visual scene 6 and a captured audio scene 4.

Therefore searching both different sets of one or more microphones 2 and different physical rotation angles 44 of the microphones 2 to find a combination of a first set of one or more microphones 2 and a first physical rotation angle 44 of the microphones 2 that captures the audio scene 4 with acceptable detected noise is dependent upon one or more parameters, controlled by a user, that change relative prioritization between a captured visual scene 6 and a captured audio scene 4.

The searching uses an algorithm to find a captured visual scene 6 and a captured audio scene 4 that satisfies the relative prioritization and maximizes/minimizes the objective cost function In one example, the relative prioritization results in an optimal audio scene 4 irrespective of visual scene 6. In one example, the relative prioritization results in an optimal visual scene 6 irrespective of audio scene 4. In one example, the relative prioritization results in a best available audio scene 4 while maintaining a target visual scene 6. In one example, the relative prioritization results in a best available visual scene 6 while maintaining a target audio scene 4.

In one example, the objective cost function is a weighted summation of a 'distance' of
a captured audio scene 4 from an optimal or acceptable audio scene and a 'distance' of a captured visual scene 6 from an optimal or acceptable visual scene. The relative prioritization between a captured visual scene 6 and a captured audio scene 4 can be controlled by changing a ratio of the weights used, in the summation, for of the 'distance' of the captured audio scene 4 from an optimal or acceptable audio scene and the 'distance' of a captured visual scene 6 from an optimal or acceptable visual scene.

In some examples, a particular configuration of detected noise (e.g. noise, noise level or noise type detected at certain microphones 2 when at a certain physical rotation angle 44) of the microphones 2 can be associated with a combination of a defined set of one or more microphones 2 and a defined physical rotation angle 44 of the microphones 2.

When that particular configuration of detected noise (e.g. noise, noise level or noise type detected at certain microphones 2 when at a certain physical rotation angle 44) of the microphones 2 is detected the associated combination of a defined set of one or more microphones 2 and a defined physical rotation angle 44 of the microphones 2 can be used for capturing the audio scene 4 without performing the search 106 or can be used as a starting position for the search 106.

In some examples, the defined set of one or more microphones 2 is the first set and the defined physical rotation angle 44 of the microphones 2 is the first physical rotation angle 44, found as consequence of searching both different sets of one or more microphones 2 and different physical rotation angles 44 of the microphones 2 to find a combination of a first set of one or more microphones 2 and a first physical rotation angle 44 of the microphones 2 that captures the audio scene 4 with acceptable detected noise. The search can be performed in dependence
upon determining that the captured audio scene 4 has unacceptable detected noise.

That detected noise can be recorded in a look-up database as a particular configuration of detected noise in association with the combination of the defined set of one or more microphones 2 and the defined physical rotation angle 44 of the microphones 2.

In some examples, a sequence of particular configurations of detected noise (e.g. noise, noise level or noise type detected at certain microphones 2 when at a certain physical rotation angle 44) of the microphones 2 can be associated with a sequence of microphone(s)/angle combinations. Each microphone(s)/angle combination is a combination of a defined set of one or more microphones 2 and a defined physical rotation angle 44 of the microphones 2.

Thus, spatially varying patterns of noise can be associated with different microphone(s)/angle combinations for use in capturing the audio scene 4 without performing a search 106 or as a starting point for a search 106. Each microphone(s)/angle combination can have, for use, the same or different set of microphones 2 and/or the same or different physical rotation angle 44.

Thus, time varying patterns of noise can be associated with different microphone(s)/angle combinations for use in capturing the audio scene 4 without performing a search 106. Each microphone(s)/angle combination can have, for use, the same or different set of microphones 2 and/or the same or different physical rotation angle 44.

In some example machine learning can be used for the classification of configurations of detected noise and the association of different configurations of detected noise with different microphone(s)/angle combinations.

Figure 7:
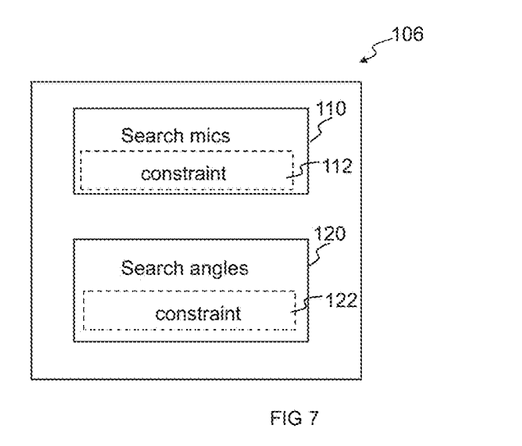
FIG. 7 illustrates an example of a search.

FIG. 7 schematically illustrates the search 106. The search 106 involves searching 110 different sets of one or more microphones 2 and searching 120 different physical rotation angles 44 of the microphones 2. The searches 110, 120 are performed contemporaneously to find, as an outcome, a combination of a first set of one or more microphones 2 and a first physical rotation angle 44 of the microphones 2 that captures the audio scene 4 with acceptable detected noise.

The search 120 of different physical rotation angles 44 of the microphones 2 can be a constrained search 122. For example, the physical rotation angles 44 of the mounted camera 22 can be constrained such that a selected visual object remains within the captured visual scene 6 at the searched physical rotation angles 44 of the microphones 2 and/or the physical rotation angles 44 of the mounted camera 22 can be constrained such that a selected audio object remains within the captured audio scene 4 at the searched physical rotation angles 44 of the microphones 2.

The search 110 of different sets of one or more microphones 2 can be a constrained search 112. For example, noisy microphones 2 can be removed from the population of microphones used to fill the different sets of one or more microphones 2 that are used in the search.

Figure 8:
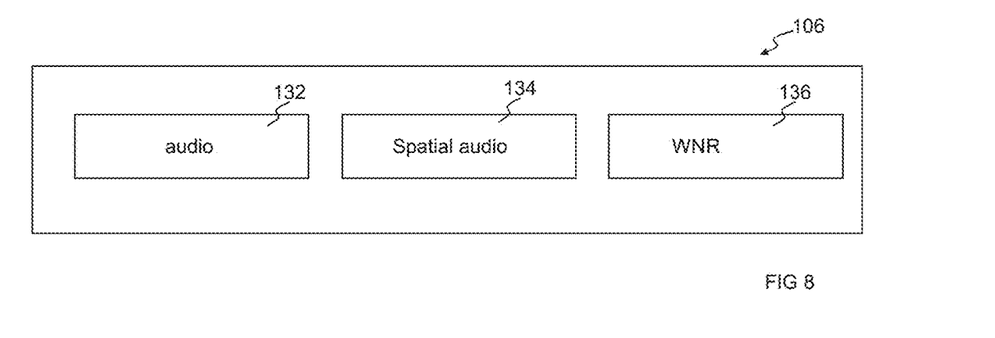
FIG. 8 illustrates examples of searches.

FIG. 8 illustrates an example in which the search 106 finds, as an outcome, a combination of a first set of one or more microphones 2 and a first physical rotation angle 44 of the microphones 2 that captures the audio scene 4 with acceptable detected noise. The search 106 can be prioritized to produce 134 an outcome that favours spatial audio. The search 106 can be prioritized to produce 136 an outcome that favours high performance algorithmic noise reduction, for example wind noise reduction. The search 106 can be prioritized to produce 132 an outcome that favours high quality mono or stereo audio.

In some examples, the spatial audio search 134 is prioritized over the noise reduction search 136, which is prioritized over mono or stereo audio.

A microphone(s)/angle combination that is suitable for spatial audio will be found preferentially. If a microphone(s)/angle combination that is suitable for spatial audio cannot be found by the search 134, then a microphone(s)/angle combination that is suitable for noise reduction will be sought by search 136. If a microphone(s)/angle combination that is suitable for noise reduction cannot be found by the search 136, then a microphone(s)/angle combination that is suitable mono or stereo audio will be sought by the search 132.

In some examples, a microphone(s)/angle combination that is suitable for spatial audio will be searched for first and then a microphone(s)/angle combination that is suitable for noise reduction will be searched next, before the set of one or more microphones 2 is changed. Thus for a particular set of one or more microphones 2, all available physical rotation angles 44 of the microphones 2 are searched using a search 134 that prioritizes spatial audio, then if that search is unsuccessful all available physical rotation angles 44 of the microphones 2 are searched using a search 136 that prioritizes noise reduction. If that search is unsuccessful then the set of one or more microphones 2 is changed, for example, the number of microphones is reduced. The noisy microphone can be removed from the set, for example.

In some examples, the search 106 finds an outcome with a maximum number of undistorted microphones 2 or an outcome where a noise reduction algorithm performs optimally.

Each of FIGS. 9A, 10A, 11A, 12A, 13A, 14A, 15A, 16A illustrates an example of an image sensor 24 of a camera 22.

Each of FIGS. 9B, 10B, 11B, 12B, 13B, 14B, 15B, 16B illustrate an example of a visual scene 6 captured by the image sensor 24 of respective FIGS. 9A, 10A, 11A, 12A, 13A, 14A, 15A, 16A.

The image sensor 24 is an array of sensels. Sensels is a recognized portmanteau for 'sensor elements', in a manner equivalent to pixels for 'picture elements'. Each sensel in the image sensor 24 can provide a pixel of the visual scene 6. The array is a fixed array of N rows by M columns of sensels. A sensel of the image sensor 24 can be identified by its row I (i=1, 2 . . . N) and its column j (j=1, 2, 3 . . . M).

A logical sub-portion 26 of the image sensor 24 is sub-array of sensels. The array is an array of n rows by m columns of sensels. A sensel of the sub-portion can be identified by its row (i=a, a+1, . . . a+n where a≥1, N≥a+n) and its column (j=b, b+1, . . . b+m where b≥1, M≥b+m). The logical sub-portion 26 is therefore a rectangle of sensels with vertices (i, j) at (a, b), (a+n, b), (a, b+m), (a+n, b+m). The sub-portion 26 is less than the whole of the image sensor 24.

The logical sub-portion 26 can be used to produce the visual scene 6. That is the output from the sensels of the logical sub-portion 26 can be used to provide pixels of the visual scene 6.

The logical sub-portion 26 can be moved by changing (a,b), that is by changing a and/or b. This can be achieved logically by the controller 70 by controlling which sensels of the image sensor 24 are accessed during an image sensor read-out period.

The logical sub-portion 26 can be re-sized by changing n and/or m. The parameters n and or m can be variable and in some but not necessarily all examples the proportion n/m (aspect ratio) is locked. Re-sizing can be achieved logically by the controller 70 by controlling which sensels of the image sensor 24 are accessed during a sensor read-out period.

In at least some examples, the visual scene 6 that can be captured by the image sensor 24 can comprise a visual object 28, for example "T" in these FIGs. In some examples, the visual object 28 is illustrated on the image sensor 24 and also in the visual scene 6 captured by the image sensor 24.

In some examples, the apparatus 20 is configured to automatically track a selected visual object 28 to keep the selected visual object 28 within the captured visual scene 6. The automatic tracking can, in some examples, comprise physical movement of the camera 22 as previously described. The automatic tracking can, in some examples, comprise virtual movement of a sub-portion 26 of the image sensor 24 used to capture the visual scene 6.

The user can select the visual object 28.

FIGS. 9A & 9B, 10A & 10B, 11A & 11B illustrate digital zoom.

Figure 9A:
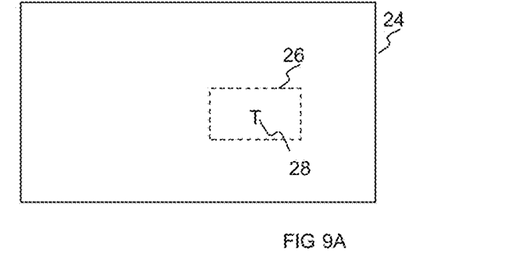
Figure 9B:
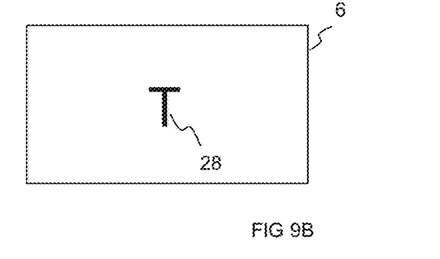
Figure 10A:
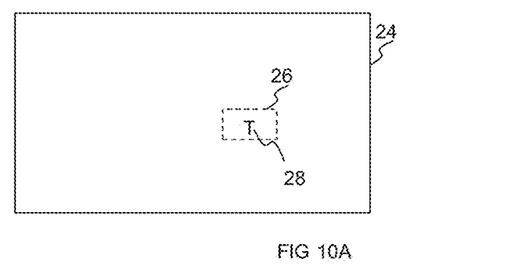
Figure 10B:
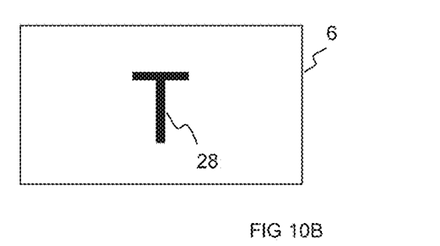
Figure 11A:
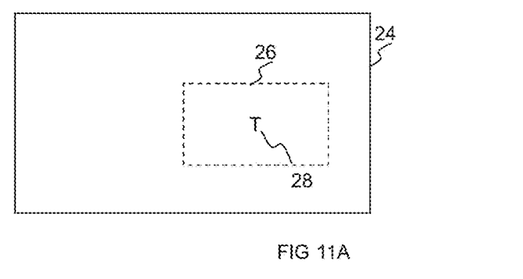
Figure 11B:
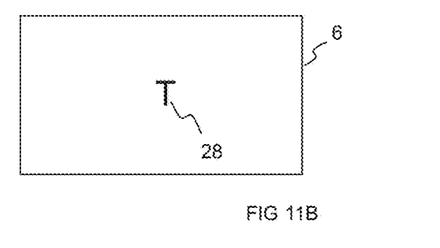

FIG. 9A illustrates a sub-portion 26 of the image sensor 24 used to capture the visual scene 6, which is illustrated in FIG. 9B. FIG. 10A illustrates a logical sub-portion 26 of the image sensor 24 used to capture the visual scene 6, which is illustrated in FIG. 10B. FIG. 11A illustrates a logical sub-portion 26 of the image sensor 24 used to capture the visual scene 6 which is illustrated in FIG. 11B.

The controller 70 by re-sizing the logical sub-portion 26 of the image sensor 24 used to capture the visual scene 6 causes a zoom-in or zoom-out on the selected visual object

28. The smallest sub-portion 26 (FIG. 10A) produces the largest zoom-in (FIG. 10B). The largest sub-portion 26 (FIG. 11A) produces the largest zoom-out (FIG. 11B).

In at least some examples, the controller 70 can automatically re-size the logical sub-portion 26 to keep the selected visual object 28 within the captured visual scene 6.

FIGS. 9A & 9B, 12A & 12B, 13A & 13B illustrate digital panning (horizontal and vertical).

Figure 12A:
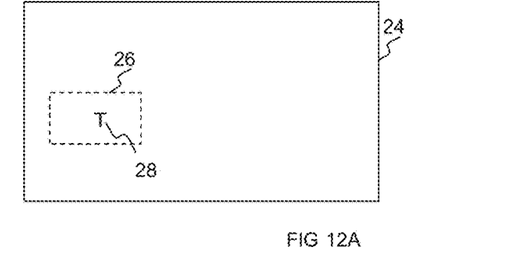
Figure 12B:
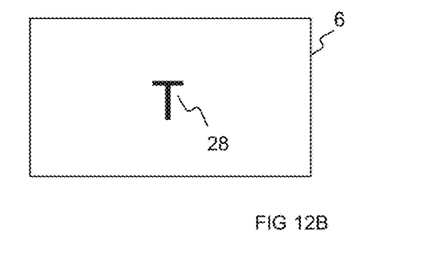
Figure 13A:
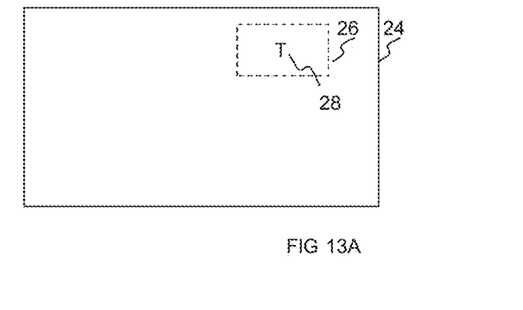
Figure 13B:
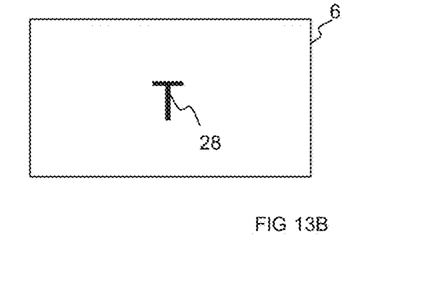

FIG. 9A illustrates a sub-portion 26 of the image sensor 24 used to capture the visual scene 6, which is illustrated in FIG. 9B. FIG. 12A illustrates a logical sub-portion 26 of the image sensor 24 used to capture the visual scene 6, which is illustrated in FIG. 12B. FIG. 13A illustrates a logical sub-portion 26 of the image sensor 24 used to capture the visual scene 6, which is illustrated in FIG. 13B.

The controller 70 by moving the logical sub-portion 26 of the image sensor 24, used to capture the visual scene 6, across the image sensor 24 causes a panning shot of the visual scene 6.

In at least some examples, the controller 70 can automatically move the logical sub-portion 26 to keep the selected visual object 28 within the captured visual scene 6.

The sequence of FIGS. 9A & 9B, 10A & 10B, 11A & 11B illustrate tracking of a selected visual object 28 using digital zoom. The sequence of FIGS. 9A & 9B, 12A & 12B, 13A & 13B illustrate tracking of a selected visual object 28 using digital panning (horizontal and vertical). The sequence of FIGS. 14A & 14B, 15A & 15B, 16A & 16B illustrate tracking of a selected visual object 28 using digital zoom and/or digital panning (horizontal and/or vertical).

Figure 14A:
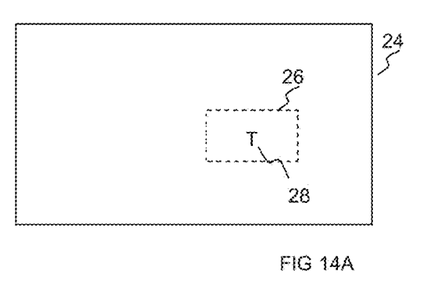
Figure 14B:
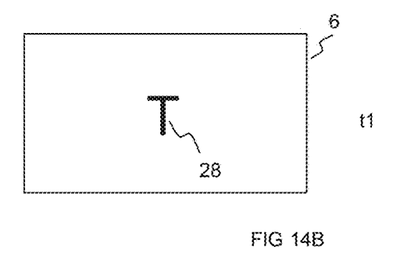
Figure 15A:
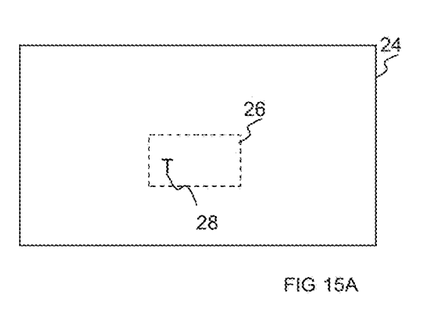
Figure 15B:
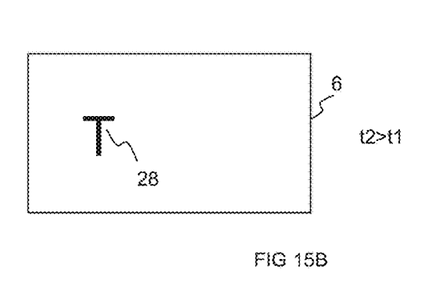
Figure 16A:
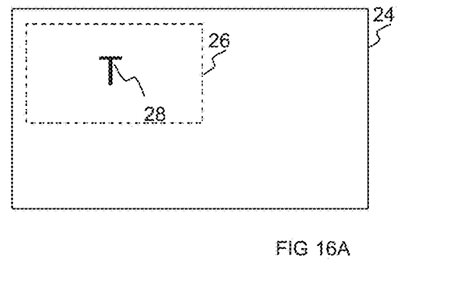
Figure 16B:
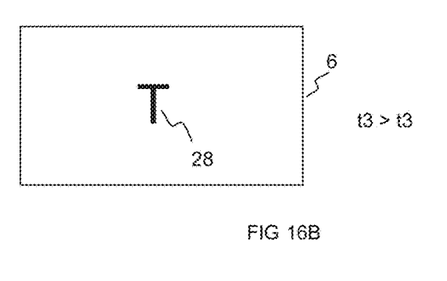

FIG. 14A illustrates a sub-portion 26 of the image sensor 24 used to capture the visual scene 6 at time t1. The captured visual scene 6 is illustrated in FIG. 14B. FIG. 15A illustrates a logical sub-portion 26 of the image sensor 24 used to capture the visual scene 6 at a later time t2. The captured visual scene 6 is illustrated in FIG. 15B. FIG. 16A illustrates a logical sub-portion 26 of the image sensor 24 used to capture the visual scene 6 at an event later time t3. The captured visual scene 6 is illustrated in FIG. 16B.

The controller 70 by moving and/or re-sizing the logical sub-portion 26 of the image sensor 24, used to capture the visual scene 6, causes panning and/or zooming of the visual scene 6.

In at least some examples, the controller 70 can automatically move and/or re-size the logical sub-portion 26 to keep the selected visual object 28 within the captured visual scene 6.

In some examples, for example where the apparatus 20 comprises multiple cameras 22 with different points of view (see FIG. 4B for an example), then each of the respective image sensors 24 of the respective cameras can be used as described above. In some examples, the controller 70 is configured to use a first camera 22 or a second camera 22 to keep a selected visual object 28 within the captured visual scene 6. That is the controller 70 can switch from using the first camera 22 to using the second camera 22 to keep the selected visual object 28 within the captured visual scene 6.

FIGS. 17A and 17B and FIGS. 18A and 18B schematically illustrate different examples using the apparatus 20. The apparatus 20 can be as previously described.

In the examples of FIG. 17A, 17B, 18A, 18B wind 80 results in the output from the microphones $2_D$ being distorted to an unacceptable degree by wind noise and the output from the beam steering microphones $2_G$ being good (not distorted to an unacceptable degree by wind noise).

Figure 17A:
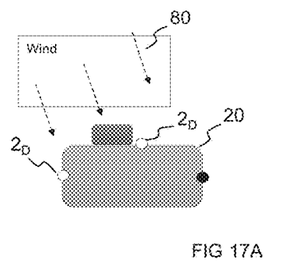
FIGS. 17A and 17B illustrate an example of reducing an effect of wind noise.
Figure 17B:
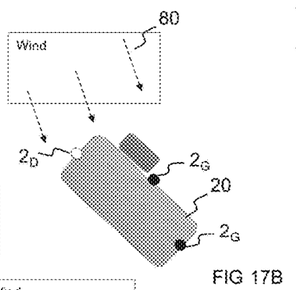

In FIG. 17A the captured audio scene 4 has unacceptable detected wind noise. As a result of determining that the captured audio scene 4 has unacceptable detected wind noise, the apparatus 20 searches both different sets of one or more microphones 2 and different physical rotation angles 44 of the microphones 2 to find a combination of a first set of one or more microphones 2 and a first physical rotation angle 44 of the microphones 2 that captures the audio scene 4 with acceptable detected wind noise. As illustrated in FIG. 17B, the apparatus 20 then controls the physical rotation angle 44 of the microphones 2 to be the first physical rotation angle 44 of the microphones 2 and captures the audio scene 4 using the combination of the first set of one or more microphones 2 and the first physical rotation angle 44 of the microphones 2. In FIG. 17A two out of three microphones 2 have unacceptable wind noise. In FIG. 17B two out of three microphones 2 have acceptable or no wind noise. The search has minimized the number of unusable microphones 2.

Figure 18A:
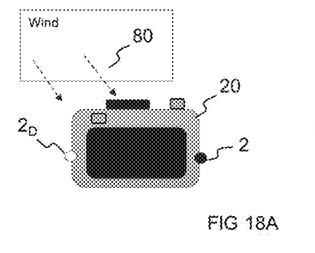
FIGS. 18A and 18B illustrate another example of reducing an effect of wind noise.
Figure 18B:
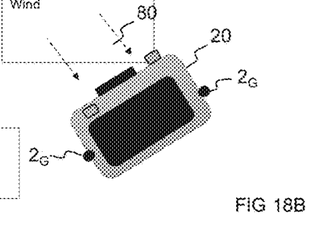

In FIG. 18A the captured audio scene 4 has unacceptable detected wind noise. As a result of determining that the captured audio scene 4 has unacceptable detected wind noise, the apparatus 20 searches both different sets of one or more microphones 2 and different physical rotation angles 44 of the microphones 2 to find a combination of a first set of one or more microphones 2 and a first physical rotation angle 44 of the microphones 2 that captures the audio scene 4 with acceptable detected wind noise. As illustrated in FIG. 18B, the apparatus 20 then controls the physical rotation angle 44 of the microphones 2 to be the first physical rotation angle 44 of the microphones 2 and captures the audio scene 4 using the combination of the first set of one or more microphones 2 and the first physical rotation angle 44 of the microphones 2. In FIG. 18A one out of two microphones 2 have unacceptable wind noise. In FIG. 18B two out of two microphones 2 have acceptable or no wind noise. The search has minimized the number of unusable microphones 2.

FIGS. 17A and 17B illustrate a first physical rotation angle 44 as a yaw rotation. FIGS. 18A and 18B illustrate a first physical rotation angle 44 as a roll rotation. In some examples, the first physical rotation angle 44 found by the search can be a combination of both a yaw rotation and a roll rotation.

Wind noise can, for example, be detected by audio clipping.

In some circumstances the dynamic response of a microphone 2 is saturated by its response to noise, such as wind noise. For example, the maximum sound pressure level could be exceeded. In such circumstances, the signal that is additional to the (wind) noise cannot be detected.

Wind noise can, for example, be detected by digitally processing outputs from the microphones 2. A wind noise detection (WND) algorithm can be used to detect unacceptable detected wind noise.

In some examples, a WND algorithm can detect wind noise by detecting high energy and/or high variability at low frequency (<50 Hz).

The controller 70 can be configured to digitally process the audio scene 4 captured using the combination of the first set of one or more microphones 2 and the first physical rotation angle 44 of the microphones 2 using a wind noise reduction algorithm (WNR).

In some examples, wind-noise can be attenuated using a bandpass filter or other frequency selective filter.

In any of the preceding examples, a camera 22 or cameras 22 can be configured to capture still images. In any of the preceding examples, a camera 22 or cameras 22 can be configured to capture sequential images (video).

In any of the preceding examples, the apparatus 20 can be a security apparatus.

In any of the preceding examples, the apparatus 20 can be a surveillance apparatus.

In any of the preceding examples, the apparatus 20 can be a fixed location apparatus. In any of the preceding examples, the apparatus 20 can be a mobile apparatus.

In any preceding examples, the arrangement 10 of microphones 2 can be a nonlinear-microphone-arrangement 10. A linear-microphone-arrangement is an arrangement of microphones 2 where the microphones 2 are aligned along a line.

A non linear-microphone-arrangement is an arrangement of microphones 2 that is not a linear-microphone-arrangement. A non linear-microphone-arrangement can have microphones 2 distributed over an area or a volume, for example.

In any preceding examples, the arrangement of microphones in the set of microphones used to capture an audio scene can be a nonlinear-microphone-arrangement 10.

In any of the preceding examples, the apparatus can comprise any number of cameras 22 including no cameras 22. The apparatus 20 can, in some examples, be an audio apparatus without a camera.

The conditional search described above can be permanently operational or can be operational as a consequence of user input. For example, the method of FIG. 6 can become operational in response to a user input at the user interface 50. In some examples, the user interface 50 can provide live audio to the user and the user can make the method of FIG. 6 operational in real-time to improve the captured audio.

Figure 19:
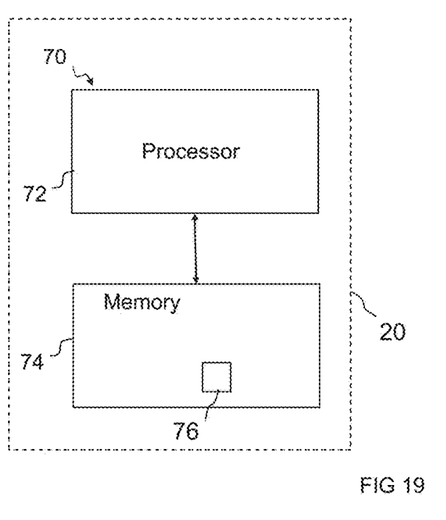
FIG. 19 illustrates a controller.

FIG. 19 illustrates an example of a controller 70. Implementation of a controller 70 may be as controller circuitry. The controller 70 may be implemented in hardware alone, have certain aspects in software including firmware alone or can be a combination of hardware and software (including firmware).

As illustrated in FIG. 19 the controller 70 may be implemented using instructions that enable hardware functionality, for example, by using executable instructions of a computer program 76 in a general-purpose or special-purpose processor 72 that may be stored on a computer readable storage medium (disk, memory etc) to be executed by such a processor 72.

The processor 72 is configured to read from and write to the memory 74. The processor 72 may also comprise an output interface via which data and/or commands are output by the processor 72 and an input interface via which data and/or commands are input to the processor 72.

The memory 74 stores a computer program 76 comprising computer program instructions (computer program code) that controls the operation of the apparatus 20 when loaded into the processor 72. The computer program instructions, of the computer program 76, provide the logic and routines that enables the apparatus to perform the methods illustrated and/or described. The processor 72 by reading the memory 74 is able to load and execute the computer program 76.

The apparatus 20 therefore comprises:
at least one processor 72; and
at least one memory 74 including computer program code
the at least one memory 74 and the computer program code configured to, with the at least one processor 72, cause the apparatus 20 at least to perform:
in dependence upon a determination that a captured audio scene has unacceptable detected noise, searching both different sets of one or more microphones of a microphone arrangement and different physical rotation angles of the microphone arrangement to find a combination of a first set of one or more microphones of the microphone arrangement and a first physical rotation angle of the microphone arrangement that captures the audio scene with acceptable detected noise; and
controlling the physical rotation angle of the microphone arrangement to be the first physical rotation angle of the microphone arrangement and capturing the audio scene using the combination of the first set of one or more microphones of the microphone arrangement and the first physical rotation angle of the microphone arrangement.

Figure 20:
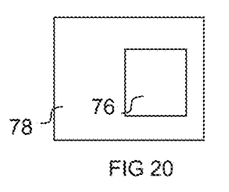
FIG. 20 illustrates a computer program.

As illustrated in FIG. 20, the computer program 76 may arrive at the apparatus 20 via any suitable delivery mechanism 78. The delivery mechanism 78 may be, for example, a machine readable medium, a computer-readable medium, a non-transitory computer-readable storage medium, a computer program product, a memory device, a record medium such as a Compact Disc Read-Only Memory (CD-ROM) or a Digital Versatile Disc (DVD) or a solid state memory, an article of manufacture that comprises or tangibly embodies the computer program 76. The delivery mechanism may be a signal configured to reliably transfer the computer program 76. The apparatus 20 may propagate or transmit the computer program 76 as a computer data signal.

Computer program instructions for causing an apparatus to perform at least the following or for performing at least the following:
in dependence upon a determination that a captured audio scene has unacceptable detected noise, searching both different sets of one or more microphones of a microphone arrangement and different physical rotation angles of the microphone arrangement to find a combination of a first set of one or more microphones of the microphone arrangement and a first physical rotation angle of the microphone arrangement that captures the audio scene with acceptable detected noise; and
controlling the physical rotation angle of the microphone arrangement to be the first physical rotation angle of the microphone arrangement and capturing the audio scene using the combination of the first set of one or more microphones of the microphone arrangement and the first physical rotation angle of the microphone arrangement.

The computer program instructions may be comprised in a computer program, a non-transitory computer readable medium, a computer program product, a machine readable medium. In some but not necessarily all examples, the computer program instructions may be distributed over more than one computer program.

Although the memory 74 is illustrated as a single component/circuitry it may be implemented as one or more separate components/circuitry some or all of which may be integrated/removable and/or may provide permanent/semi-permanent/dynamic/cached storage.

Although the processor 72 is illustrated as a single component/circuitry it may be implemented as one or more separate components/circuitry some or all of which may be integrated/removable. The processor 72 may be a single core or multi-core processor.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used in this application, the term 'circuitry' may refer to one or more or all of the following:
(a) hardware-only circuitry implementations (such as implementations in only analog and/or digital circuitry) and
(b) combinations of hardware circuits and software, such as (as applicable):
(i) a combination of analog and/or digital hardware circuit(s) with software/firmware and
(ii) any portions of hardware processor(s) with software (including digital signal processor(s)), software, and memory(ies) that work together to cause an apparatus, such as a mobile phone or server, to perform various functions and
(c) hardware circuit(s) and or processor(s), such as a microprocessor(s) or a portion of a microprocessor(s), that requires software (e.g. firmware) for operation, but the software may not be present when it is not needed for operation.

This definition of circuitry applies to all uses of this term in this application, including in any claims.

As a further example, as used in this application, the term circuitry also covers an implementation of merely a hardware circuit or processor and its (or their) accompanying software and/or firmware. The term circuitry also covers, for example and if applicable to the particular claim element, a baseband integrated circuit for a mobile device or a similar integrated circuit in a server, a cellular network device, or other computing or network device.

The blocks illustrated in the Figs and/or as described, may represent steps in a method and/or sections of code in the computer program 76. The illustration of a particular order to the blocks does not necessarily imply that there is a required or preferred order for the blocks and the order and arrangement of the block may be varied. Furthermore, it may be possible for some blocks to be omitted.

The preceding description also describes a class of apparatuses where the apparatus 20 comprises means for:
capturing an audio scene 4 using a microphone arrangement 10 comprising multiple microphones 2;
determining that the captured audio scene 4 has unacceptable detected noise;
in dependence upon determining that the captured audio scene 4 has unacceptable detected noise, searching both different sets of one or more microphones 2 of the microphone arrangement 10 and different physical rotation angles 44 of the microphone arrangement 10 to find a combination of a first set of one or more microphones 2 of the microphone arrangement 10 and a first physical rotation angle 44 of the microphone arrangement 10 that captures the audio scene 4 with acceptable detected noise; and
controlling the physical rotation angle 44 of the microphone arrangement 10 to be the first physical rotation angle 44 of the microphone arrangement 10 and capturing the audio scene 4 using the combination of the first set of one or more microphones 2 of the microphone arrangement 10 and the first physical rotation angle 44 of the microphone arrangement 10.

The preceding description also describes a class of methods where the methods comprise:
capturing an audio scene 4;
controlling physical rotation of a mounted camera 22 comprising an image sensor 24 and microphones 2, to reposition the image sensor 24 and the microphones 2, wherein repositioning the microphones 2 reduces detected noise at the microphones 2;
automatically moving a logical sub-portion 26 of the image sensor 24, used to capture an image of a visual scene 6, across the image sensor 24 to keep a selected visual object within the captured visual scene 6.

Where a structural feature has been described, it may be replaced by means for performing one or more of the functions of the structural feature whether that function or those functions are explicitly or implicitly described.

The recording of data may comprise only temporary recording, or it may comprise permanent recording or it may comprise both temporary recording and permanent recording, Temporary recording implies the recording of data temporarily. This may, for example, occur during sensing or image capture, occur at a dynamic memory, occur at a buffer such as a circular buffer, a register, a cache or similar. Permanent recording implies that the data is in the form of an addressable data structure that is retrievable from an addressable memory space and can therefore be stored and retrieved until deleted or over-written, although long-term storage may or may not occur. The use of the term 'capture' in relation to an image or audio relates to temporary recording of the data of the image. Whenever an image or audio is captured it can subsequently be stored. The use of the term 'store' relates to permanent recording of the data of the image or audio.

The systems, apparatus, methods and computer programs may use machine learning which can include statistical learning. Machine learning is a field of computer science that gives computers the ability to learn without being explicitly programmed. The computer learns from experience E with respect to some class of tasks T and performance measure P if its performance at tasks in T, as measured by P, improves with experience E. The computer can often learn from prior training data to make predictions on future data. Machine learning includes wholly or partially supervised learning and wholly or partially unsupervised learning. It may enable discrete outputs (for example classification, clustering) and continuous outputs (for example regression). Machine learning may for example be implemented using different approaches such as cost function minimization, artificial neural networks, support vector machines and Bayesian networks for example. Cost function minimization may, for example, be used in linear and polynomial regression and K-means clustering. Artificial neural networks, for example with one or more hidden layers, model complex relationship between input vectors and output vectors. Support vector machines may be used for supervised learning. A Bayesian network is a directed acyclic graph that represents the conditional independence of a number of random variables.

The above described examples find application as enabling components of:
automotive systems; telecommunication systems; electronic systems including consumer electronic products; distributed computing systems; media systems for generating or rendering media content including audio, visual and audio visual content and mixed, mediated, virtual and/or augmented reality; personal systems including personal health systems or personal fitness systems; navigation systems; user interfaces also known as human machine interfaces; networks including cellular, non-cellular, and optical networks; ad-hoc networks; the internet; the internet of things; virtualized networks; and related software and services.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one." or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. An apparatus comprising:
   at least one processor; and
   at least one memory including computer program code, the at least one memory and the computer program code configured to, with the at least one processor, cause the apparatus to perform at least the following:
      capture an audio scene using multiple microphones;
      determine that the captured audio scene has unacceptable detected noise;
      in dependence upon the determining that the captured audio scene has unacceptable detected noise, search a plurality of combinations of the multiple microphones and a plurality of physical rotation angles of the multiple microphones to determine a combination of a first set of one or more microphones and a first physical rotation angle of the one or more microphones that captures the audio scene with acceptable detected noise, wherein the determination that the one or more microphones captures the audio scene with acceptable detected noise is based on a cost function; and
      control the physical rotation angle of the microphones to be the first physical rotation angle of the microphones and capture the audio scene by the combination of the first set of one or more microphones and the first physical rotation angle of the one or more microphones.

2. The apparatus as claimed in claim 1, wherein the controlling of the physical rotation angle of the microphones further comprises; electrically control the physical rotation angle of a mounted camera comprising an image sensor for capturing a visual scene and at least some of the multiple microphones.

3. The apparatus as claimed in claim 2, further configured to cause to automatically track a selected visual object to keep the selected visual object within the captured visual scene.

4. The apparatus as claimed in claim 2, further configured to cause to automatically move a logical sub-portion of the image sensor, used to capture an image of a visual scene, across the image sensor to keep a selected visual object within the captured visual scene.

5. The apparatus as claimed in claim 2, further configured to cause to automatically re-size a logical portion of the image sensor, used to capture an image of a visual scene, to keep a selected visual object within the captured visual scene.

6. The apparatus as claimed in claim 3, further configured to cause to enable a user to select the visual object.

7. The apparatus as claimed in claim 2, further comprising an additional camera comprising an image sensor for capturing a visual scene wherein the camera and the additional camera have different points of view, the apparatus further configured to cause to use the camera or the additional camera to keep a selected visual object within the captured visual scene.

8. The apparatus as claimed in claim 2, wherein the searching of the plurality of combinations of the multiple microphones and the plurality of physical rotation angles of the multiple microphones to determine the combination of the first set of the one or more microphones and the first physical rotation angle of the one or more microphones that captures the audio scene with acceptable detected noise is dependent upon one or more parameters, controlled by a user, that change relative prioritization between the captured visual scene and the captured audio scene.

9. The apparatus as claimed in claim 1, wherein the controlling of the physical rotation angle of the microphones further comprises; electrically control the physical rotation angle of a mounted camera comprising an image sensor for capturing a visual scene and the microphones, wherein the search of the different physical rotation angles of the microphones is a constrained search, wherein the physical rotation angles of the mounted camera are constrained such that a selected visual object remains within the captured visual scene at the first physical rotation angle of the microphones.

10. The apparatus as claimed in claim 1, wherein the search of the plurality of combinations of the multiple microphones and the plurality of physical rotation angles of the multiple microphones is a constrained search, wherein noisy microphones are removed from the different sets of the one or more microphones.

11. The apparatus as claimed in claim 1, wherein the different physical rotation angles of the microphones that are searched comprise multiple components, wherein the searching of the different physical rotation angles of the microphones comprises searching different combinations of values for the components of the physical rotation angles of the microphones.

12. The apparatus as claimed in claim 1, wherein the searching of the plurality of combinations of the multiple microphones and a plurality of physical rotation angles of the multiple microphones to find, as an outcome, a combination of the first set of one or more microphones and the first physical rotation angle of the one or more microphones that captures the audio scene with acceptable detected noise is a search to find the outcome with a maximum number of undistorted microphones or the outcome where a noise reduction algorithm performs optimally.

13. The apparatus as claimed in claim 1, further configured to cause to use a wind noise detection algorithm to detect unacceptable detected noise.

14. A method comprising:
determining that a captured audio scene, captured using a microphone arrangement comprising multiple microphones, has unacceptable detected noise;
in dependence upon the determination that the captured audio scene has unacceptable detected noise, searching a plurality of combinations of the multiple microphones of the microphone arrangement and a plurality of physical rotation angles of the multiple microphones of the microphone arrangement to determine a combination of a first set of one or more microphones of the microphone arrangement and a first physical rotation angle of the one or more microphones of the microphone arrangement that captures the audio scene with acceptable detected noise, wherein the determination that the one or more microphones captures the audio scene with acceptable detected noise is based on a cost function; and
controlling the physical rotation angle of the multiple microphones of the microphone arrangement to be the first physical rotation angle of the one or more microphones of the microphone arrangement and capturing the audio scene using the combination of the first set of one or more microphones of the microphone arrangement and the first physical rotation angle of the one or more microphones of the microphone arrangement.

15. The method as claimed in claim 14, wherein the controlling of the physical rotation angle of the one or more microphones comprises electrically controlling the physical rotation angle of a mounted camera comprising an image sensor for capturing a visual scene and at least some of the multiple microphones.

16. The method as claimed in claim 15, further comprising automatically tracking a selected visual object to keep the selected visual object within the captured visual scene.

17. The method as claimed in claim 15, further comprising automatically moving a logical sub-portion of the image sensor, used to capture an image of a visual scene, across the image sensor to keep a selected visual object within the captured visual scene.

18. The method as claimed in claim 15, further comprising automatically re-sizing a logical portion of the image sensor, used to capture an image of a visual scene, to keep a selected visual object within the captured visual scene.

19. The method as claimed in claim 16, further comprising enabling a user to select the visual object.

20. A non-transitory computer readable medium comprising program instructions stored thereon for performing at least the following:
in dependence upon a determination that a captured audio scene has unacceptable detected noise, searching a plurality of combinations of multiple microphones of a microphone arrangement and a plurality of physical rotation angles of the multiple microphones of the microphone arrangement to determine a combination of a first set of one or more microphones of the microphone arrangement and a first physical rotation angle of the one or more microphones of the microphone arrangement that captures the audio scene with acceptable detected noise, wherein the determination that the one or more microphones captures the audio scene with acceptable detected noise is based on a cost function; and
controlling the physical rotation angle of the one or more microphones of the microphone arrangement to be the first physical rotation angle of the one or more microphones of the microphone arrangement and capturing the audio scene using the combination of the first set of one or more microphones of the microphone arrangement and the first physical rotation angle of the one or more microphones of the microphone arrangement.

\* \* \* \* \*